United States Patent
Lau et al.

(10) Patent No.: US 10,927,461 B2
(45) Date of Patent: Feb. 23, 2021

(54) GAS DIFFUSER SUPPORT STRUCTURE FOR REDUCED PARTICLE GENERATION

(71) Applicant: Applied Materials, Inc., Santa Clara, CA (US)

(72) Inventors: Allen K. Lau, Cupertino, CA (US); Robin L. Tiner, Santa Cruz, CA (US); Lai Zhao, Campbell, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 229 days.

(21) Appl. No.: 16/119,505

(22) Filed: Aug. 31, 2018

(65) Prior Publication Data
US 2020/0071833 A1 Mar. 5, 2020

(51) Int. Cl.
*C23C 16/455* (2006.01)
(52) U.S. Cl.
CPC .............. *C23C 16/45591* (2013.01)
(58) Field of Classification Search
CPC .......... C23C 16/45591; C23C 16/4401; C23C 16/45565
See application file for complete search history.

(56) References Cited

U.S. PATENT DOCUMENTS

| | | | |
|---|---|---|---|
| 5,643,394 A * | 7/1997 | Maydan | C23C 16/45574 118/723 E |
| 6,461,435 B1 | 10/2002 | Littau et al. | |
| 2005/0199184 A1 * | 9/2005 | Murugesh | C23C 16/4405 118/715 |
| 2007/0022952 A1 | 2/2007 | Ritchie et al. | |
| 2007/0044714 A1 * | 3/2007 | White | C23C 16/45565 118/715 |
| 2011/0098841 A1 * | 4/2011 | Tsuda | C23C 16/45582 700/117 |
| 2013/0004681 A1 * | 1/2013 | Tso | C23C 16/45565 427/569 |
| 2015/0110959 A1 * | 4/2015 | Ashizawa | C23C 16/45544 427/255.391 |
| 2015/0167705 A1 * | 6/2015 | Lee | H01J 37/32449 156/345.34 |
| 2020/0071833 A1 * | 3/2020 | Lau | C23C 16/4401 |

(Continued)

FOREIGN PATENT DOCUMENTS

| | | | | |
|---|---|---|---|---|
| JP | 2009239082 A | * | 10/2009 | ......... H01L 21/0228 |
| JP | 2009239082 A | | 10/2009 | |
| JP | 2015078418 A | * | 4/2015 | ............. C23C 16/52 |

(Continued)

OTHER PUBLICATIONS

International Search Report and Written Opinion for Application No. PCT/US2019/043672 dated Nov. 11, 2019.

(Continued)

*Primary Examiner* — Jeffrie R Lund
(74) *Attorney, Agent, or Firm* — Patterson + Sheridan LLP

(57) ABSTRACT

Embodiments of the present disclosure generally provide apparatus and methods for gas diffuser support structure for a vacuum chamber. The gas diffuser support structure comprises a backing plate having a central bore formed therethrough, an integrated cross structure formed in the central bore, and a gas deflector coupled to the cross structure by a single fastener.

20 Claims, 2 Drawing Sheets

(56) References Cited

U.S. PATENT DOCUMENTS

2020/0165726 A1* 5/2020 Lau .................. C23C 16/45563

FOREIGN PATENT DOCUMENTS

| JP | 2015078418 A | | 4/2015 | | |
|----|----|----|----|----|----|
| KR | 20080071342 | | 8/2008 | | |
| TW | 201001594 A | | 1/2010 | | |
| TW | 201528405 A | | 7/2015 | | |
| WO | WO-2020046510 A1 | * | 3/2020 | ....... | C23C 16/45565 |

OTHER PUBLICATIONS

Taiwan Office Action for Application No. 108126903 dated Sep. 16, 2020.

* cited by examiner

GAS DIFFUSER SUPPORT STRUCTURE FOR REDUCED PARTICLE GENERATION

BACKGROUND

Field

Embodiments of the present disclosure generally relate to a gas or plasma diffuser with a supporting structure for a plasma chamber.

Description of the Related Art

Plasma enhanced chemical vapor deposition (PECVD) is a deposition method whereby processing gas is introduced into a processing chamber through a backing plate, through a diffuser and then to a gas distribution showerhead. The showerhead is electrically biased to ignite the processing gas into a plasma. A pedestal, sitting opposite to the showerhead, is electrically grounded and functions as an anode as well as a substrate support. The plasma of processing gases forms on or more films on the substrate.

Periodic chamber cleaning of interior chamber components is performed by flowing a plasma of cleaning gas radicals along and through the same flow path as the processing gases. For example, the cleaning gases are ignited into a plasma outside of the processing chamber and flow through the backing plate, the diffuser, and through the showerhead. The plasma of cleaning gas radicals is typically about 400 degrees Celsius, or greater, and causes portions of the flow path to expand. After cleaning, the portions of the gas path gradually cool. This thermal cycling is repeated multiple times during a production period.

However, the thermal cycling causes portions of the gas path to expand or contract at different rates. The differential expansion between adjacent parts causes the parts to rub against each other, which creates particles. These particles are then entrained into the flow path and contaminate the chamber. The particles remaining in the flow path may be entrained into the processing gas flow which contaminates a substrate during deposition processes. Particle contamination of the substrate reduces yield.

Therefore, what is needed is an apparatus and method for supporting a gas diffuser in a processing chamber.

SUMMARY

Embodiments of the present disclosure generally provide apparatus and methods for gas diffuser support structure for a vacuum chamber. In one embodiment, the gas diffuser support structure comprises a backing plate having a central bore formed therethrough, an integrated cross structure formed in the central bore, and a gas deflector coupled to the cross structure by a single fastener.

In another embodiment, a gas diffuser support structure for a vacuum chamber is disclosed that includes a backing plate having a central bore formed therethrough, and an integrated cross structure formed in the central bore, wherein the cross structure comprises a plurality of spokes that separate a plurality of openings.

In another embodiment, a gas diffuser support structure for a vacuum chamber is disclosed that includes a backing plate having a central bore formed therethrough, an integrated cross structure formed in the central bore, wherein the cross structure comprises a plurality of spokes that separate a plurality of openings, and a gas deflector coupled to the cross structure by a single fastener.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally provide apparatus and methods for supporting a gas diffuser in a processing chamber. The disclosure will be described below in relation to a plasma enhanced chemical vapor deposition (PECVD) apparatus available from AKT America, Inc., a subsidiary of Applied Materials, Inc., Santa Clara, Calif. It is to be understood that the disclosure has applicability in other deposition chambers as well, including deposition chambers and PECVD apparatus available from other manufacturers.

Figure 1:
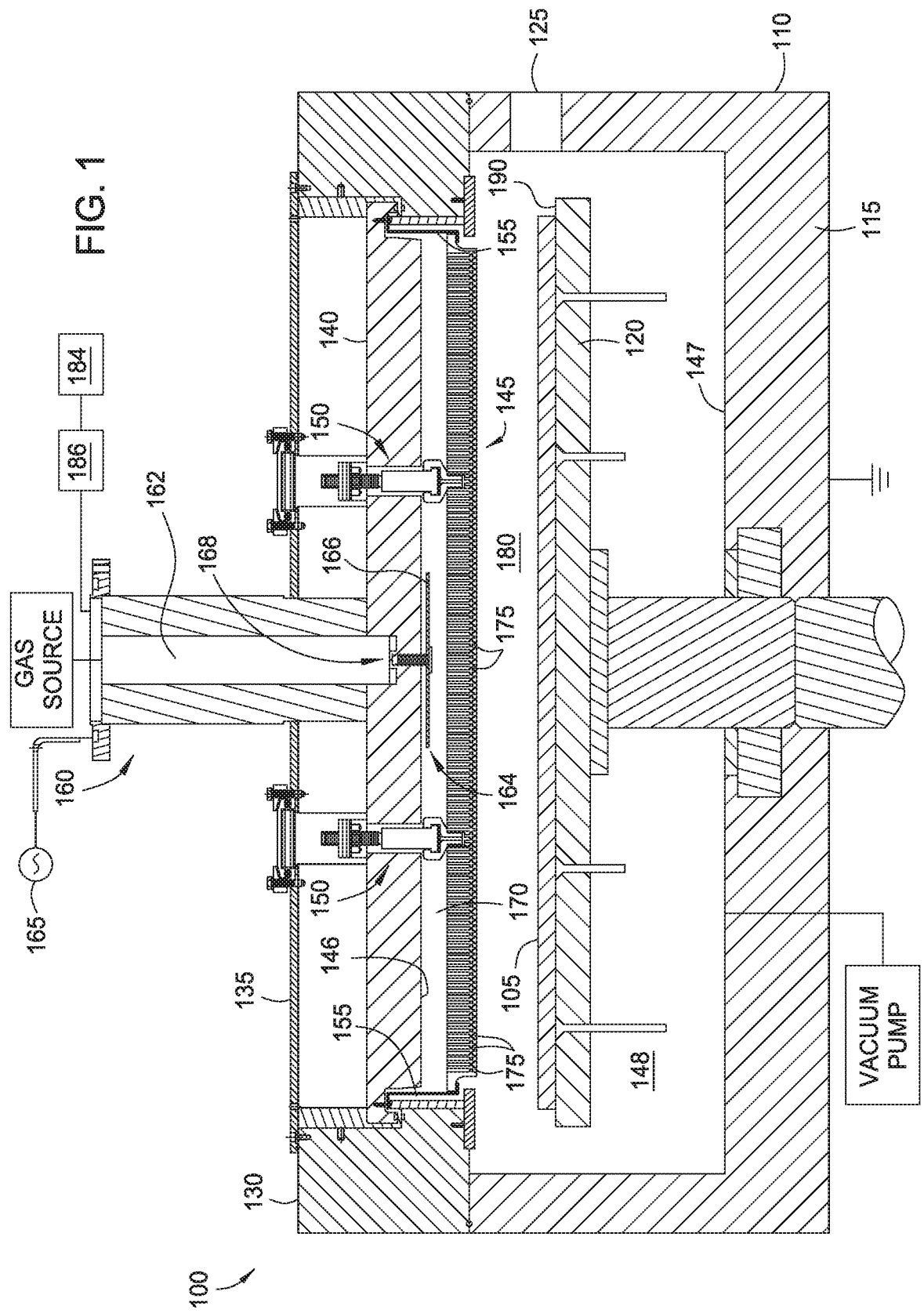
FIG. 1 is a schematic side cross-sectional view of one embodiment of a chamber.

FIG. 1 is a schematic side cross-sectional view of one embodiment of a chamber 100. The chamber 100 is suitable for PECVD processes for fabricating circuitry on a large area substrate 105 made of glass, a polymer, or other suitable substrate. The chamber 100 is configured to form structures and devices on the large area substrate 105 for use in the fabrication of liquid crystal displays (LCD's) or flat panel displays, photovoltaic devices for solar cell arrays, or other structures. The structures may be a plurality of back channel etch inverted staggered (bottom gate) thin film transistors which may comprise a plurality of sequential deposition and masking steps. Other structures may include p-n junctions to form diodes for photovoltaic cells.

The chamber 100 includes a chamber sidewall 110, a bottom 115, a substrate support 120, such as a pedestal, which supports the large area substrate 105 during processing. The gas distribution showerhead 145 is positioned opposite the substrate support 120 and the large area substrate 105. The chamber 100 also has a port 125, such as a slit valve opening, that facilitates transfer of the large area substrate 105 into and out of the chamber 100 by selectively opening and closing. The chamber 100 also includes a lid structure 130, a backing plate 140, and a gas distribution showerhead 145. In one embodiment, the lid structure 130 supports the backing plate 140 and the gas distribution showerhead 145. In one embodiment, an interior surface 146 of the backing plate 140 and an interior surface 147 of the chamber sidewall 110 bounds a variable pressure region 148. In one aspect, the chamber 100 comprises a body which includes the chamber sidewall 110, the bottom 115 and the backing plate 140 bounding the variable pressure region 148. The backing plate 140 is sealed on its perimeter by suitable o-rings at interfaces where the backing plate 140 and the lid structure 130 may contact each other. The o-rings facilitate electrical insulation as well as seal the variable pressure region 148 when negative pressure is provided by a vacuum pump coupled to the chamber 100.

In one embodiment, the gas distribution showerhead 145 is supported by the backing plate 140 at a central region thereof by one or more center support members 150. The one or more center support members 150 facilitate support of the gas distribution showerhead 145 at the central region of the gas distribution showerhead 145 to control the horizontal profile of the gas distribution showerhead 145 to mitigate the tendency of the gas distribution showerhead 145 to droop or sag due to one or a combination of heat, gravity and vacuum. The gas distribution showerhead 145 may also be supported at a perimeter thereof by a flexible suspension 155. The flexible suspension 155 is adapted to support the gas distribution showerhead 145 from its edges and to allow lateral expansion and contraction of the gas distribution showerhead 145.

The chamber 100 is coupled to a gas inlet 160 that is coupled to a gas source and a plasma source 165. The plasma source 165 may be a direct current power source or a radio frequency (RF) power source. The RF power source may be inductively or capacitively coupled to the chamber 100. The gas inlet 160 delivers process from the gas source through a bore 162 to a gas diffuser assembly 164. The gas diffuser assembly 164 includes a perforated gas deflector 166. The gas deflector 166 is fastened to a center of the backing plate 140. The gas deflector 166 receives gases passing through the bore 162 from a gas baffle 168. The gas baffle 168 is integrated with the backing plate 140. The gas deflector 166 is fastened to a center of the gas baffle 168.

Gases flow through the bore 162 to the gas baffle 168 and are spread by the gas deflector 166 into an intermediate region 170 defined between the backing plate 140 and the gas distribution showerhead 145. In one example of operation, process gases are delivered from the gas source while the interior of the chamber 100 has been pumped down to a suitable pressure by the vacuum pump. One or more process gases flow through the gas inlet 160 to the gas baffle 168 to the intermediate region 170 defined between the backing plate 140 and the gas distribution showerhead 145. The one or more process gases then flow from the intermediate region 170 through a plurality of openings or gas passages 175 formed through the gas distribution showerhead 145 to a processing region 180 defined in an area below the gas distribution showerhead 145 and above the substrate support 120.

The large area substrate 105 is raised from a transfer position to the processing region 180 by moving the substrate support 120 toward the gas distribution showerhead 145. The height of the processing region 180 may be varied as a process parameter based on a spacing between a lower surface of the gas distribution showerhead 145 and a substrate receiving surface 190 of the substrate support 120. The substrate support 120 may be heated by an integral heater, such as heating coils or a resistive heater coupled to or disposed within the substrate support 120.

A plasma may be formed in the processing region 180 by the plasma source 165 coupled to the chamber 100. The plasma excited gas is deposited thereon to form structures on the large area substrate 105. In one embodiment, the substrate support 120 is at ground potential to facilitate plasma formation in the processing region 180. A plasma may also be formed in the chamber 100 by other means, such as a thermally induced plasma. Although the plasma source 165 is shown coupled to the gas inlet 160 in this embodiment, the plasma source 165 may be coupled to the gas distribution showerhead 145 or other portions of the chamber 100.

After processing the substrate 105, the substrate 105 is transferred out of the chamber 100, and a cleaning process is performed. Cleaning gases, such as fluorine-containing gases, are provided from a cleaning gas source 184. The cleaning gases are ignited into a plasma in a remote plasma chamber 186. The plasma of cleaning gases flow through the bore 162 of the gas inlet 160, and through the gas baffle 168 where the plasma is spread by the gas deflector 166. The plasma then flows through the gas passages 175 of the gas distribution showerhead 145 in order to clean chamber interior surfaces.

Conventional gas diffusion apparatus include a separate part that is bolted or otherwise fastened to a lower surface of the backing plate 140 and/or a device that is installed at least partially in the gas inlet 160. However, the hot plasma causes differential expansion between the backing plate 140 and the conventional gas diffusion apparatus. Continued thermal cycling of the chamber 100 causes parts of the conventional gas diffusion apparatus to rub against the backing plate 140, which causes particles. Additionally, the fasteners utilized to couple the conventional gas diffusion apparatus to the backing plate 140 include an anodized coating, which may wear off due to the differential expansion, which creates more particles. The particles have been found to entrain with gas flows in the chamber 100 and a portion of the particles contaminate the substrate.

Figure 2B:
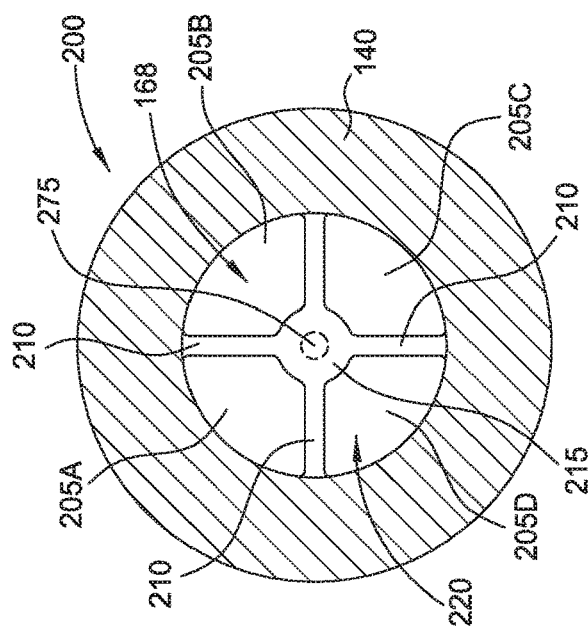
FIG. 2B is a partial sectional view of a portion of the gas diffuser support assembly along lines 2B-2B of FIG. 2A To facilitate understanding, identical reference numerals have been used, where possible, to designate identical elements that are common to the figures. It is also contemplated that elements and features of one embodiment may be beneficially incorporated on other embodiments without further recitation.
Figure 2A:
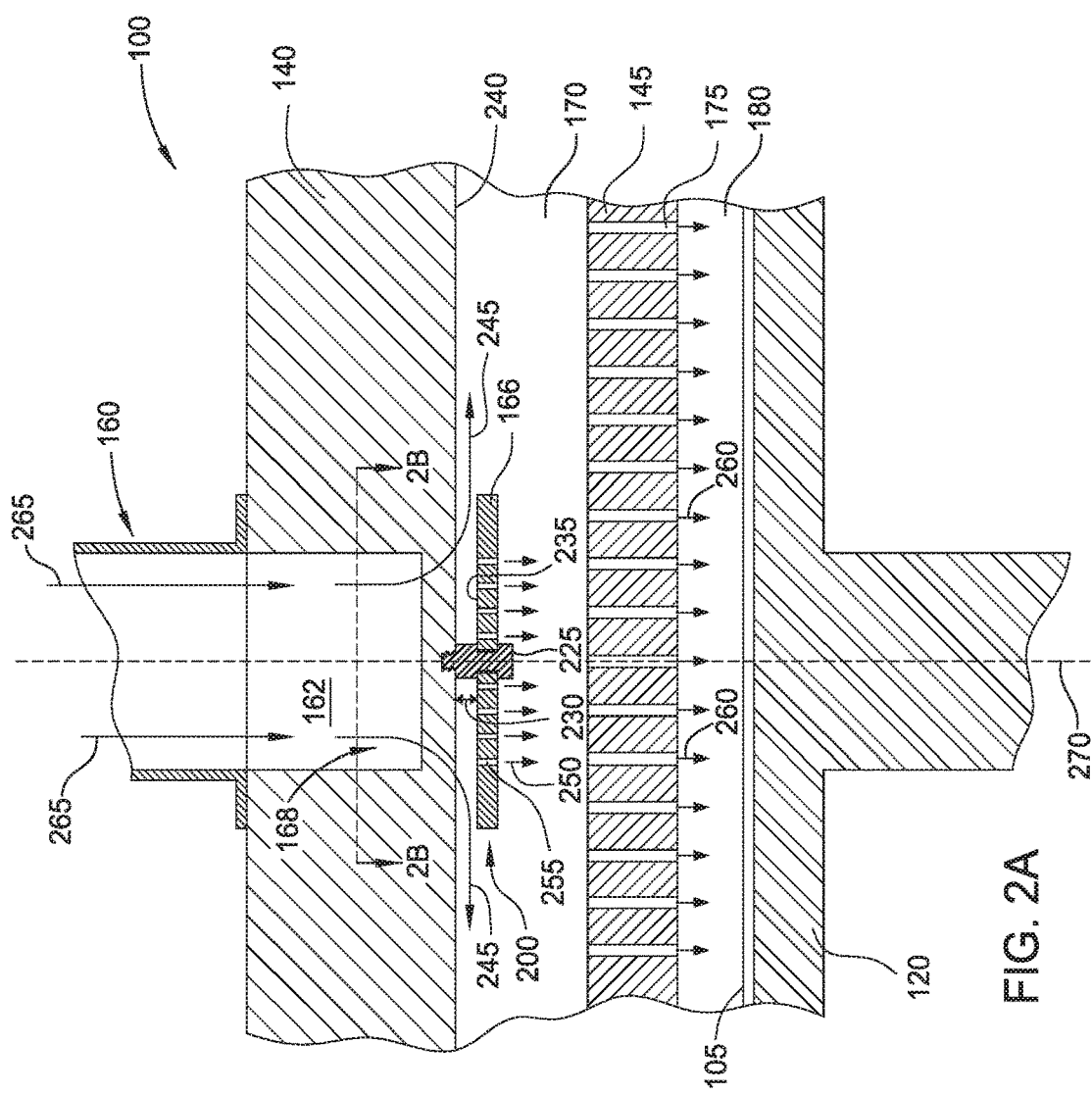
FIG. 2A is a partial schematic sectional view of the chamber having a gas diffuser support assembly in accordance with one embodiment of the disclosure.

FIG. 2A is a partial schematic sectional view of the chamber 100 having a gas diffuser support assembly 200 in accordance with one embodiment of the disclosure. The gas diffuser support assembly 200 comprises the gas baffle 168 formed integrally in the backing plate 140 and the gas deflector 166 coupled thereto. FIG. 2B is a partial sectional view of a portion of the gas diffuser support assembly 200 along lines 2B-2B of FIG. 2A.

As shown in FIG. 2B, the gas baffle 168 includes a plurality of openings 205A-205D. Each of the openings 205A-205D is separated by a spoke 210. Each of the spokes 210 are joined in a geometric center of the backing plate 140 at a hub 215. Each of the spokes 210, formed from the material of the backing plate 140, comprise a cross structure 220. Each of the openings 205A-205D are provided in quadrants separated by the spokes 210. Each of the openings 205A-205D are sized to maximize gas flow or conductance. The open area of the openings 205A-205D is increased from conventional gas diffusion apparatus by about 50% using the cross structure 220 as described herein. In one embodiment, the open area of the openings 205A-205D is about 7 square inches.

In one embodiment, the spokes 210 are positioned at 90 degree intervals within the cross structure 220. In one embodiment, the spokes 210 are substantially straight along the length direction.

As shown in FIG. 2A, the gas deflector 166 is coupled to the backing plate 140 by a single fastener 225. The fastener 225 is a bolt or screw, such as a shoulder screw. The fastener 225 couples to a threaded hole 275 formed in the hub 215 (shown in phantom in FIG. 2B). The fastener 225 also maintains a gap 230 between an upper surface 235 of the gas deflector 166 and a lower surface 240 of the backing plate 140.

In operation, gases from the gas source of FIG. 1 or a plasma of cleaning gases from the remote plasma chamber 186 of FIG. 1 is flowed through the bore 162. The flow is provided along a conductance path through the openings 205A-205D of the gas baffle 168 into the intermediate region 170 defined between the backing plate 140 and the gas distribution showerhead 145. The conductance path includes multiple flow paths such as lateral flow paths 245 around the gas deflector 166 and downward flow paths 250 through a plurality of through-holes 255 formed in the gas deflector 166. The conductance path continues to the processing region 180 via flow paths 260 through the gas passages 175 formed through the gas distribution showerhead 145.

In one embodiment, the gap 230 (between the backing plate 140 and the gas deflector 166) is between about 0.15 inches to about 0.5 inches. In one embodiment, the gap 230 is about 0.25 inches.

In one embodiment, the through-holes 255 are evenly distributed across the major surfaces of the gas deflector 166. In one embodiment, each of the through-holes 255 has a diameter between about 0.05 inches to about 0.2 inches. In one embodiment, each through-hole 255 has a diameter of about 0.1 inches.

As shown in FIG. 2A, the gas deflector 166 substantially blocks the majority of a vertical downward gas or plasma flow 265 from the bore 162 and generates lateral flow paths 245 that are substantially horizontal, which are substantially parallel to the backing plate 140 and the gas distribution showerhead 145. A small portion of the vertical downward gas or plasma flow 265 goes through the plurality of through-holes 255 in the gas deflector 166 and generates downward flow paths 250 that are generally parallel to a longitudinal axis 270 of the backing plate 140 and/or the chamber 100.

The gas diffuser support assembly 200 as described herein substantially eliminates particle formation as well as other problems experienced with conventional gas diffusion apparatus. Stresses that may cause rubbing between parts are significantly reduced in the gas diffuser support assembly 200 as described herein as compared to conventional gas diffusion apparatus. For example, maximum lateral deformation is decreased by greater than 10% using the gas diffuser support assembly 200 as described herein. The maximum vertical deformation is decreased by greater than 99% using the gas diffuser support assembly 200 as described herein. Maximum Von-Mises stress is decreased by about 80% using the gas diffuser support assembly 200 as described herein. Reaction force (indicating rubbing between the backing plate 140 and the conventional gas diffusion apparatus) is decreased by greater than 99% using the gas diffuser support assembly 200 as described herein. Reaction moment (indicating rubbing between mounting hardware of the conventional gas diffusion apparatus) is decreased by greater than 98% using the gas diffuser support assembly 200 as described herein.

While the foregoing is directed to embodiments of the present disclosure, other and further embodiments of the disclosure may be devised without departing from the basic scope thereof, and the scope thereof is determined by the claims that follow.

The invention claimed is:

1. A gas diffuser support structure for a vacuum chamber, the gas diffuser support structure comprising:
   a backing plate made of a material;
   a central bore formed in the backing plate;
   a cross structure formed in the material of the backing plate and positioned at a bottom of the central bore; and
   a gas deflector coupled to the cross structure by a single fastener coupled to a threaded hole formed in the cross structure.

2. The gas diffuser support structure of claim 1, wherein the cross structure comprises a plurality of spokes.

3. The gas diffuser support structure of claim 2, wherein openings are formed between the spokes.

4. The gas diffuser support structure of claim 3, wherein the openings include an open area of about 7 square inches.

5. The gas diffuser support structure of claim 2, wherein each of the spokes intersects at a hub.

6. The gas diffuser support structure of claim 5, wherein the hub is positioned at a geometric center of the backing plate.

7. The gas diffuser support structure of claim 5, wherein the single fastener is coupled to the threaded hole at the hub.

8. The gas diffuser support structure of claim 2, wherein the plurality of spokes are positioned at 90 degree intervals.

9. A gas diffuser support structure for a vacuum chamber, the gas diffuser support structure comprising:
   a backing plate having a central bore formed therein; and
   an integrated cross structure formed in a bottom of the central bore, wherein the cross structure comprises a plurality of spokes that separate a plurality of openings, and wherein a threaded hole is formed in the cross structure at an intersection of each of the plurality of spokes.

10. The gas diffuser support structure of claim 9, wherein the plurality of spokes are positioned at 90 degree intervals.

11. The gas diffuser support structure of claim 9, wherein the plurality of openings includes an open area of about 7 square inches.

12. The gas diffuser support structure of claim 9, wherein each of the spokes intersect at a hub, and the threaded hole is formed in the hub.

13. The gas diffuser support structure of claim 12, wherein the hub is positioned at a geometric center of the backing plate.

14. The gas diffuser support structure of claim 9, further comprising:
   a gas deflector coupled to the cross structure by a single fastener disposed in the threaded hole.

15. The gas diffuser support structure of claim 14, wherein the single fastener is coupled to the cross structure at a geometric center of the backing plate.

16. A gas diffuser support structure for a vacuum chamber, the gas diffuser support structure comprising:
   a backing plate made of an aluminum material and having a central bore formed therein;
   a cross structure positioned in the central bore, wherein the cross structure comprises a plurality of spokes made of the aluminum material of the backing plate that separate a plurality of openings that are in fluid communication with the central bore; and
   a gas deflector coupled to the cross structure by a single threaded fastener.

17. The gas diffuser support structure of claim 16, wherein each of the spokes intersects at a hub.

18. The gas diffuser support structure of claim 17, wherein the hub is positioned at a geometric center of the backing plate.

19. The gas diffuser support structure of claim 17, wherein the single fastener is coupled to a threaded hole formed in the hub.

20. The gas diffuser support structure of claim 16, wherein the plurality of spokes are positioned at 90 degree intervals.

* * * * *